US006816046B1

(12) United States Patent
Varney

(10) Patent No.: US 6,816,046 B1
(45) Date of Patent: Nov. 9, 2004

(54) SUPERCONDUCTING ELECTROMAGNET APPARATUS

(75) Inventor: Andrew John Varney, Kidlington (GB)

(73) Assignee: Magnex Scientific Limited, Oxfordshire (GB)

( * ) Notice: Subject to any disclaimer, the term of this patent is extended or adjusted under 35 U.S.C. 154(b) by 0 days.

(21) Appl. No.: 09/914,416

(22) PCT Filed: Feb. 24, 2000

(86) PCT No.: PCT/GB00/00658

§ 371 (c)(1),
(2), (4) Date: Aug. 27, 2001

(87) PCT Pub. No.: WO00/52490

PCT Pub. Date: Sep. 8, 2000

(30) Foreign Application Priority Data

Feb. 27, 1999 (GB) ............................................. 9904454

(51) Int. Cl.$^7$ ............................................... H01F 1/00
(52) U.S. Cl. ...................................... 335/216; 335/301
(58) Field of Search ......................... 335/216, 299–301; 324/309, 318–321

(56) References Cited

U.S. PATENT DOCUMENTS

| 4,700,136 A | * | 10/1987 | Yamaguchi et al. | ........ 324/309 |
| 4,713,722 A | | 12/1987 | Toyoda | |
| 4,812,797 A | * | 3/1989 | Jayakumar | .................. 335/299 |
| 4,945,466 A | | 7/1990 | Borland | |

FOREIGN PATENT DOCUMENTS

JP              60194504           10/1985

* cited by examiner

Primary Examiner—Lincoln Donovan
(74) Attorney, Agent, or Firm—Renner, Otto, Boisselle & Sklar, LLP

(57) ABSTRACT

A superconducting electromagnet apparatus comprises a main coil assembly (1) and a main current supply (5) energising and de-energising the main coil assembly (1), and for persisting the current flow in the main coil assembly (1) when a desired constant current level has been reached, in order to generate a central magnetic field of high homogeneity in a working volume. The apparatus further comprises a B0 shim coil assembly (2) comprising superconducting shim coils connected within a closed loop and arranged to magnetically couple with the main coil assembly (1) and an auxiliary current supply (6) for supplying current to the closed loop, and for persisting the current flow in the closed loop when a desired constant current level has been reached, in order to provide fine adjustment of the central magnetic field within the working volume without significantly degrading the homogeneity of the central magnetic field. A control circuit (31, 38) is provided for controlling the main and auxiliary current supplies (5, 6) and the main coil assembly (1), the B0 shim coil assembly (2) and the control circuit (31, 38) are adapted to at least partly compensate for the effect of variation of the magnetic field within the working volume with time. In this case the shim coil assembly performs both the function of a B0 shim and at the same time compensates for the effect of variation of the magnetic field within the working volume with time, thus avoiding the need to provide individual closed loop coil assemblies for performing these functions separately which would result in functional difficulties due to inductive coupling between these auxiliary coil assemblies.

14 Claims, 3 Drawing Sheets

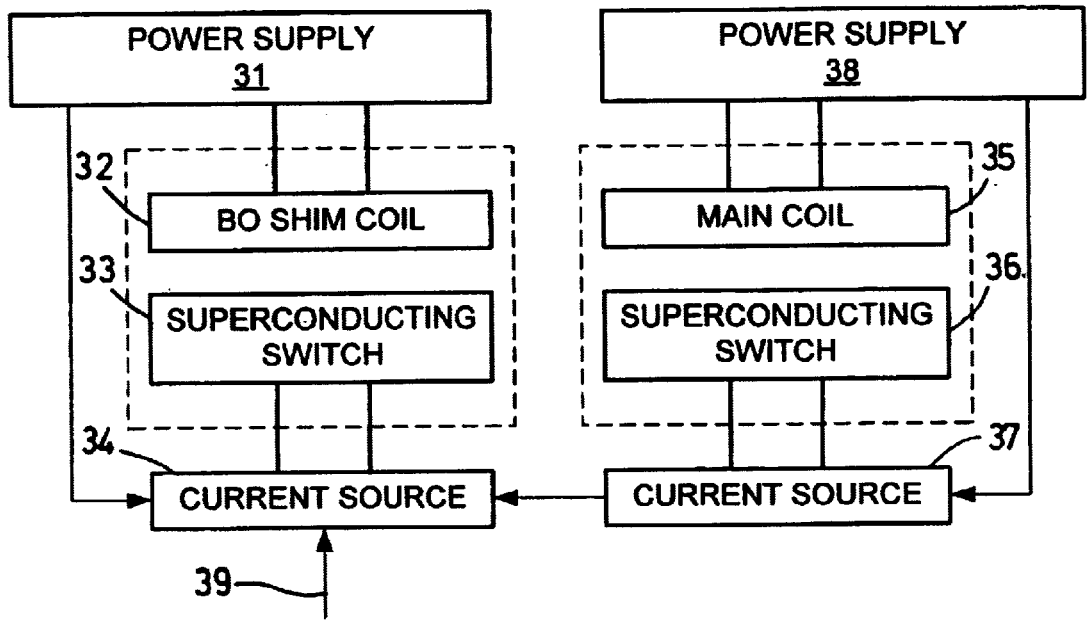
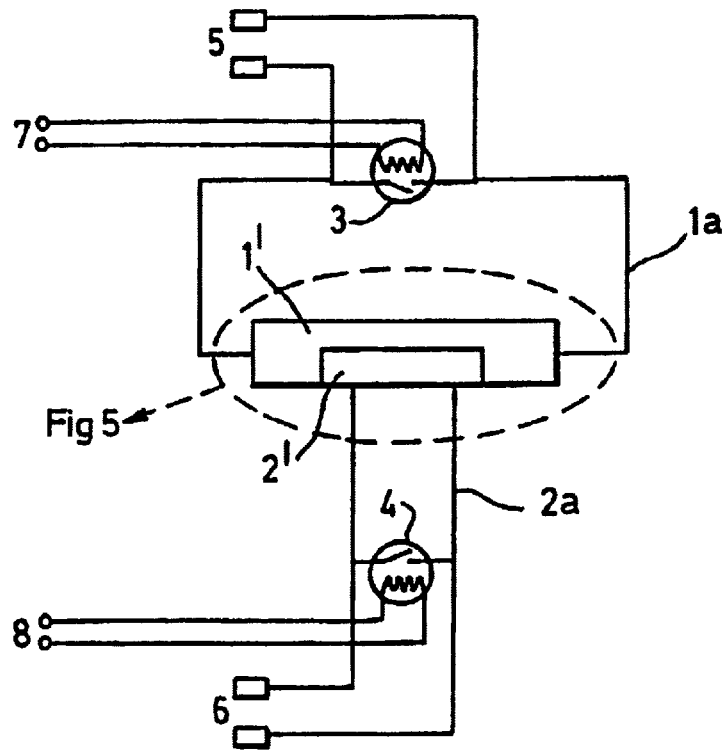

SUPERCONDUCTING ELECTROMAGNET APPARATUS

BACKGROUND OF THE INVENTION

1. Field of the Invention

This invention relates to superconducting electromagnet apparatus. Such apparatus can be used in various applications including nuclear magnetic resonance (NMR) spectroscopy and imaging and Fourier-transform mass spectrometry (FTMS).

2. Description of the Related Art Including Information Disclosed Under 37 CFR 1.97 and 1.98

In conventional superconducting electromagnet apparatus a main superconducting coil assembly of cylindrical form is used to produce a central magnetic field which varies very little over a specified working volume within the bore of the cylinder, that is the so-called homogeneity volume. In many applications of such apparatus, it is necessary for a precise value of the central magnetic field to be set. Furthermore it is often necessary or desirable to make a fine adjustment to this central magnetic field value, for example to reset the central magnetic field to the specified value after it has been altered by use of a passive or superconducting shim coil assembly (which is used to achieve the optimum degree of homogeneity within the homogeneity volume but which can sometimes lead to a slight change in the central magnetic field value). Ideally this fine adjustment should be made without any degradation of the magnetic field homogeneity within the homogeneity volume.

It is known to make use of a so-called B0 shim coil assembly to provide fine adjustment of the central magnetic field value with minimal degradation of the magnetic field homogeneity within the homogeneity volume. Such a B0 shim coil assembly comprises a plurality of superconducting coils connected in series to form a closed loop which is electrically separate from the main superconducting coil assembly but which couples magnetically with the main coil assembly. The B0 shim coils are wound on an outer former which surrounds an inner former on which the main coils are wound and within which the homogeneity volume is located. The B0 shim coil assembly also incorporates a superconducting switch within the loop and current input terminals for adjusting the amount of current passing through the shim coils and for enabling persistence of this current when the required current value is reached and the superconducting switch is closed, the required current value being zero or a positive or negative value. The geometries of the B0 shim coils are chosen so as to have substantially no effect on the homogeneity of the magnetic field within the homogeneity volume. Furthermore the B0 shim coils are constructed using materials such that the maximum required operating current is well below the critical current at which the coils are no longer superconducting and such that there is insignificant drift in the magnetic fields associated with these coils. Thus, in the persisted mode in which the uniform central magnetic field is maintained within the homogeneity volume, the current in the shim coils will remain substantially unchanged ignoring the effect of any inductive interactions with any other part of the electromagnet apparatus or with any external field source. Typically the shim coils are constructed using wire having a critical current of the same order of magnitude as the wire used for the main magnet coils.

In most circumstances the coupling of the B0 shim coil assembly with other shim coil assemblies, which are provided to correct distortions in the magnetic field due to other disturbing influences, is minimal. This can be ensured by appropriate choice of the shim coil geometries. As is well known the superconducting switch of the B0 shim coil assembly can be operated in the same manner as the superconducting switch which is provided for controlling the main coil assembly. In both cases, after the coils have been charged to the required current level from an external current source whilst the loop is open-circuited by opening of the switch, the switch is closed to allow the required constant current level to be maintained within the superconducting loop incorporating the coils. Where the main coil assembly is being initially energised, such switching of the switches associated with the main coil assembly and the B0 shim coil assembly can be effected in series. However, when the main coil assembly is in the persisted mode, switching of the B0 shim coil assembly must be effected independently of the main coil assembly to provide the required fine adjustment of the central magnetic field.

In addition to the ability to set the central magnetic field to a precise desired value, it is important in many applications that this set value remains stable with time. For example, in NMR spectroscopy, experiments conducted within the apparatus can last over several days and even small variations in the value of the central magnetic field, for example of the order of a few parts per billion, can lead to systematic differences in the spectral results obtained as a result of such experiments. There are essentially two ways in which the central magnetic field value can exhibit time-dependence, that is either as a result of a change in the ambient magnetic field due to external sources, or as a result of variation in the magnetic field generated by the main coil assembly itself.

WO 89/09475 discloses a superconducting electromagnet apparatus which makes use of an assembly of auxiliary coils which magnetically couple to the main coil assembly in order to reduce the effect of variation of the central magnetic field value due to changes in the ambient magnetic field. In such apparatus an assembly of superconducting shielding coils connected in series within a loop is arranged so that the effective areas and mutual and self inductances of the main coils and the shielding coils are such that any change in the ambient magnetic field causes changes in the currents of the main coils and the shielding coils in such a manner as to generate a change in the central magnetic field which opposes the change in the central magnetic field due to the change in the ambient magnetic field alone. The main coil assembly would itself usually partially shield the homogeneity volume from the effect of such changes in the ambient magnetic field even without the use of such shielding coils, but the shielding effect can be significantly increased by the use of the shielding coils.

Furthermore EP 0468425A discloses an active-shield superconducting electromagnet apparatus comprising a first superconducting coil assembly for generating a first magnetic field, and a second superconducting coil assembly for generating a second magnetic field, the second coil assembly being electrically connected in series with the first coil assembly and the two assemblies being arranged such that a resultant, uniform magnetic field is generated in the working volume and the second magnetic field opposes the first magnetic field externally of the apparatus so that the stray magnetic field outside the coil assemblies is very small. This enables personnel to work safely relatively close to the apparatus without requiring an excessive amount of cumbersome and expensive iron shielding.

However the automatic shielding arrangement of WO 89/09475 is no longer effective in relation to conventional active-shield superconducting electromagnet apparatus. Accordingly EP 0468425A proposes an arrangement in which screening coils connected within a closed loop are provided having a number of turns at least an order of magnitude less than the number of turns in the first and second coil assemblies so as to reduce the effect of disturbing influences on the central magnetic field whilst having an insignificant effect on the homogeneity of the central magnetic field. In this case the screening coils are wound from superconducting wire having a critical current such that they revert to the normal conducting state during quenching of the first and second coil assemblies. In this way the maximum contribution which the screening coils can make to the stray magnetic field is rendered insignificant. Furthermore the number of turns of the screening coils is so small that it is a straightforward matter to generate current in the screening coils to provide adequate screening capacity without risk of generating significant stray magnetic field.

With regard to the second effect producing variation of the central magnetic field value over time, that is variation of the magnetic field generated by the main coil assembly itself as a result of variation of the current supplied to the coil assembly, this effect can be caused by the properties of the superconducting wire which is used to wind the coils and which can result in a very slow decrease in the current (typically several parts per billion per hour of the operating current value) in a phenomenon known as "drift". It is possible to model such drift in terms of an effective residual resistance of the main coils, and to compensate for the drift on the basis of this relationship. The compensating of drift in this way is referred to as "locking". However, in order for such compensation to be effective, it is important that the drift of the current in the compensating coils is insignificant by comparison with the drift of the current in the main coils. Since the effective residual resistance increases significantly as the operating current in the coils becomes comparable with the critical current value of the wire used for winding the coils, this requires the critical current value for a given maximum current in the compensating coils to be greater than a particular minimum value.

Furthermore the conventional B0 shim coil assembly as described above actually has the effect of increasing the rate of change of the central field due to the drift of the current in the main coil assembly.

It is an object of the invention to provide superconducting electromagnet apparatus with a B0 shim coil assembly which, as well as providing fine adjustment of the central magnetic field value, also compensates for changes in the central magnetic field value with time either as a result of changes in the ambient magnetic field or as a result of changes in the field generated by the main coil assembly itself, or as a result of both such effects.

BRIEF SUMMARY OF THE INVENTION

According to the present invention there is provided superconducting electromagnet apparatus comprising a main coil assembly (1; 1') for producing a central magnetic field in a working volume, main current supply means (5) connected to the main coil assembly for energising and de-energising the main coil assembly, and for persisting the superconducting current flow in the main coil assembly when a desired constant current level has been reached, in order to generate a central magnetic field of high homogeneity in the working volume, a B0 shim coil assembly (2; 2') for providing fine adjustment of the central magnetic field, the B0 shim coil assembly comprising superconducting shim coil means connected within a closed loop and arranged to magnetically couple with the main coil assembly (1; 1'), auxiliary current supply means (6) connected to the B0 shim coil assembly for supplying current to the closed loop, and for persisting the superconducting current flow in the closed loop when a desired constant current level has been reached, in order to provide fine adjustment of the central magnetic field within the working volume without significantly degrading the homogeneity of the central magnetic field, and control means (31, 38) for controlling the main and auxiliary current supply means (5, 6), wherein the main coil assembly (1; 1'), the B0 shim coil assembly (2; 2') and the control means (31, 38) are adapted to provide significant compensation for the effect of variation of the magnetic field within the working volume with time whilst maintaining the superconducting current flows in the main coil assembly (1; 1') and the B0 shim coil assembly (2; 2').

It should be understood that the term "significant compensation" is used in this context to denote a level of compensation which is such as to lead to a significant improvement in system performance. This would include situations where an experiment or application is achievable with such "significant compensation", whereas such an experiment or application could not be performed without such compensation.

It will be appreciated that the invention provides an arrangement by which a single closed loop coil assembly can perform the function of a B0 shim whilst at the same time compensating for the effect of variation of the magnetic field within the working volume with time. The coil assembly may be adapted to compensate for the effect of time variation of the magnetic field as a result of time variation of the ambient magnetic field, or alternatively may be adapted to compensate for the effect of time variation of the magnetic field as a result of drift of the current in the main coil assembly. As a further alternative the shim coil assembly may be adapted to compensate for both of these time-varying effects. However in all cases the single closed loop coil assembly serves several functions, and thus avoids the need to provide individual closed loop coil assemblies for performing these functions separately which would result in functional difficulties in view of the fact that each such auxiliary coil assembly would couple inductively with the other auxiliary coil assemblies as well as with the main coil assembly. Furthermore the provision of separate auxiliary coil assemblies for performing the different functions individually would result in additional complications in the design and construction of the apparatus, as well as rendering the apparatus more expensive than apparatus in accordance with the invention in which a single closed loop coil assembly is adapted to perform more than one function simultaneously, that is the above-described shielding and/or locking functions in addition to the fine adjustment of the central magnetic field value.

BRIEF DESCRIPTION OF THE SEVERAL VIEWS OF THE DRAWINGS

In order that the invention may be more fully understood, superconducting electromagnet apparatus in accordance with the invention will now be described, by way of example, with reference to the accompanying drawings, in which:

FIG. 3 is a block diagram of a control system for such apparatus; and

FIGS. 4 and 5 are schematic diagrams of a second embodiment of the invention.

DETAILED DESCRIPTION OF THE INVENTION

A description will now be given of a particular form of superconducting electromagnet apparatus in accordance with the invention for use in a particular NMR spectroscopy application in which a central magnetic field of high homogeneity and high constancy with respect to time is generated. However it should be appreciated that the design of such apparatus is dictated by the particular application in which it is to be used, and that different designs of apparatus in accordance with the invention are required for other applications. Furthermore the description of such apparatus omits a description of those features which are already well known in the art, such as the particular method of fabrication of the coils and details of the associated radiation shielding and cooling arrangements.

Figure 1:
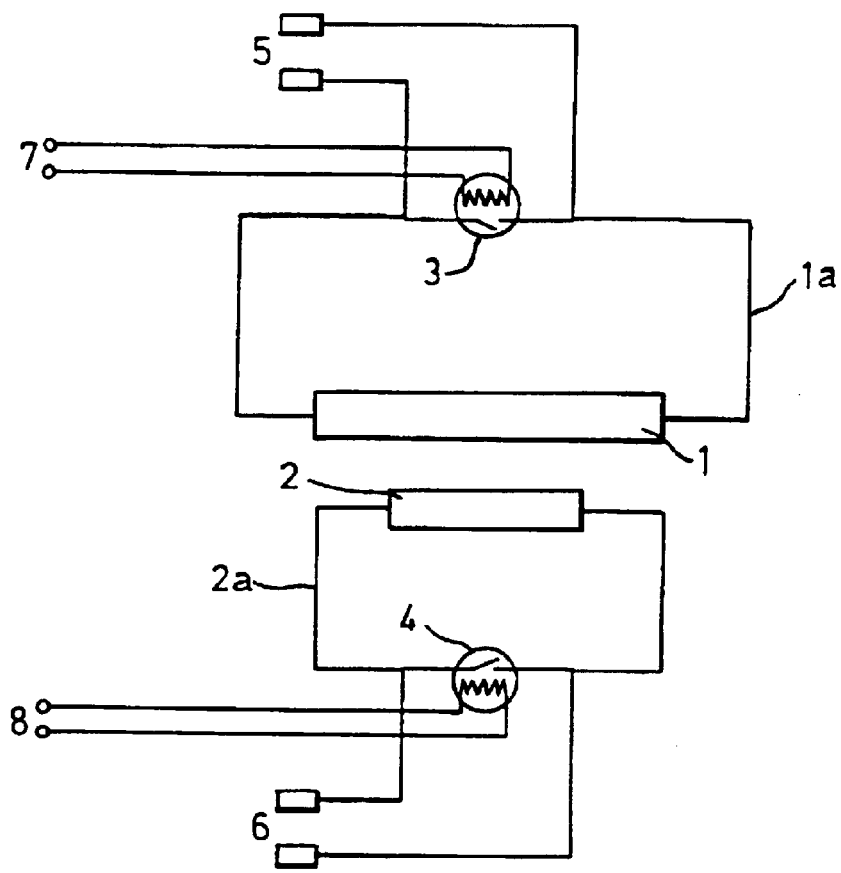
FIG. 1 is a schematic diagram of a first embodiment of the invention.

Referring to FIG. 1 the superconducting electromagnet apparatus comprises a cylindrical main coil assembly consisting of main coils 1 connected in series within a closed loop 1a including a superconducting switch 3 having a heating element and electrical connections 5 for the supply of drive current to the main coils from an external current source (not shown). The superconducting switch 3 is also provided with electrical connections 7 for the supply of current to the heating element of the switch 3. Furthermore a B0 shim coil assembly is provided in the form of B0 shim coils 2 connected in series within a closed loop 2a including a superconducting switch 4 having a heating element and electrical connections 6 for supply of drive current to the B0 shim coils from an external current source (not shown). The superconducting switch 4 is also provided with electrical connections 8 for the supply of current to the heating element of the switch 4.

Figure 2:
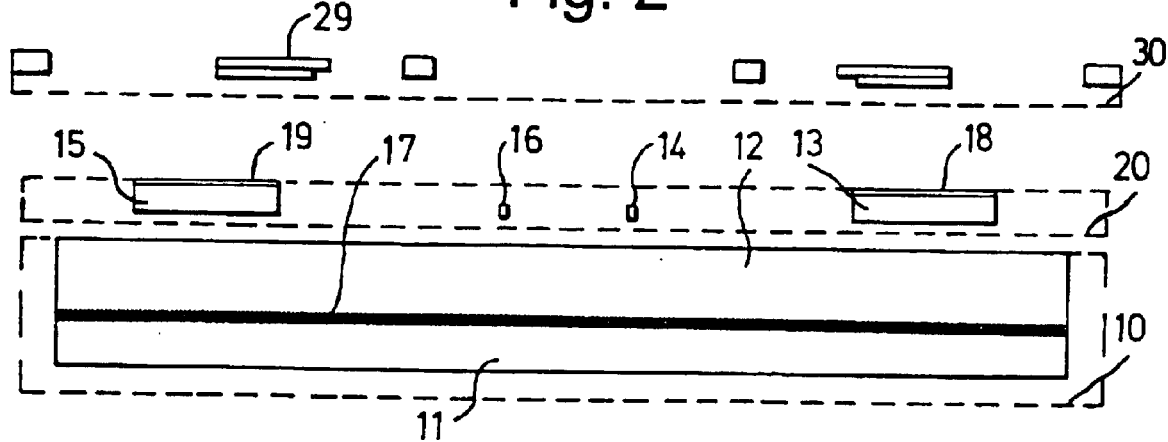
FIG. 2 is a further schematic diagram showing the positions and sizes of individual coils within the first embodiment.

FIG. 2 diagrammatically shows an upper axial section through the apparatus. It will be appreciated that the lower axial section is not shown in order to render the figure easier to read, but that this is similar to the upper axial section, and that in practice each of the coils and formers shown in the figure are of cylindrical form surrounding an axial bore 9 defining the working volume of the magnet. Referring to FIG. 2 the main coil assembly comprises two main magnet coils 11 and 12 wound on an inner cylindrical aluminium former 10 (shown in broken lines in the figure). The current circulating through the two main magnet coils 11 and 12 provides most of the central magnetic field, but the magnetic field produced by these coils would not be homogeneous enough for NMR spectroscopy applications without the provision of further compensating coils. Accordingly smaller compensating coils 13, 14, 15 and 16 are wound on a further cylindrical aluminium former 20 (also shown in broken lines in the figure) which is coaxial with, and surrounds, the inner former 10. The purpose of the smaller compensating coils 13 to 16 is to correct for most of the lowest order axial inhomogeneities introduced by the main magnet coils 11 and 12. The coils 11 to 16 are connected in series within a closed loop and are supplied with current in a manner already described above.

The design of the B0 shim coil assembly follows broadly similar principles to ensure that it produces a largely homogeneous central magnetic field contribution within the homogeneity volume. To this end the B0 shim coil assembly comprises a long solenoid coil 17 wound on the inner former 10 between the coils 11 and 12, and two smaller coils 18 and 19 wound on top of the coils 13 and 14 on the former 20 and designed to substantially cancel the lowest order inhomogeneities that would be produced by the coil 17 alone. The coils 17, 18 and 19 are connected in series within a closed loop and are supplied with current in a manner already described above. The positions of the coils 17, 18 and 19, and the numbers of turns in each coil, are chosen so that the effective B0 strength is suitable for the specific application and such as to produce favourable locking and shielding effects. In particular the central coil 17 should be positioned close to the working volume in order to provide the required locking effect. It should be noted that, since the central coil 17 is wound on the same former 10 as the main coils 11 and 12, the three coils are potted together, that is embedded within the same integral block of wax or other potting material. An outer former 30 (also shown in broken lines in the figure) is provided for the other (conventional) superconducting shim coils 29 for optimising the homogeneity of the central magnetic field within the homogeneity volume.

FIG. 3 shows a block circuit diagram of the current supply and control system for such apparatus. A power supply 31 is provided for supplying and controlling current to the B0 shim coil assembly 32, and additionally for controlling the supply of current from a current source 34 to the heating element of the superconducting switch 33 of the B0 shim coil assembly. Furthermore a power supply 38 is provided for the supply and control of current to the main coil assembly 35, as well as for controlling the supply of current from a current source 32 to the heating element of the superconducting switch 36 of the main coil assembly.

When the main magnet switch 36 is opened, the B0 shim coil switch 33 is also normally held open, the ability to control the current sources 37 and 34 serially being indicated schematically by an arrow connecting the source 37 to the source 34. In one possible arrangement the B0 shim coil switch 33 opens automatically if the main magnet develops a voltage across it above a certain threshold, for example in quench conditions or if the main coil switch 36 is open. This protects the B0 shim coil assembly 32 from damage which might otherwise result from the large current produced by inductive coupling to the main coil assembly 35 if the main coil assembly were to quench or the main coil switch were to open. It is also possible to control the B0 shim coil switch independently of the power supply 31 as shown by the arrow 39.

The specific coil geometry for both the main coil assembly and the B0 shim coil assembly in a particular example is indicated in Table 1 below. From this geometry, the effective areas for the two circuits can be calculated, and in turn the current/field ratios and the self and mutual inductances can be derived. These are given in Table 2 below. Using these parameters in equations 4, 6 and 10 of the theoretical summary set out below yields an effective B0 strength of 1.4 mT/A, a shielding factor to external influences of approximately 6, and a locking factor for central magnetic field drift of approximately 6.7.

TABLE 1

Geometry of particular example

| coil | mean radius (cm) | width (cm) | turns |
|---|---|---|---|
| 11 | 4.58 | 33.00 | 7330 |
| 12 | 5.76 | 33.00 | 21146 |
| 13 | 7.17 | 4.70 | 1066 |
| 14 | 7.03 | 0.20 | 18 |
| 15 | 7.17 | 4.70 | 1066 |
| 16 | 7.03 | 0.20 | 18 |
| 17 | 5.01 | 33.00 | 3662 |
| 18 | 7.43 | 4.70 | 103 |
| 19 | 7.43 | 4.70 | 103 |

TABLE 2

Calculated parameters of particular example

| | |
|---|---|
| Mutual inductance of main magnet and B0 | 2.98 H |
| Self inductance of main magnet | 25.88 H |
| Self inductance of B0 shim | 0.3892 H |
| Effective area of main magnet | 307.3 m² |
| Effective area of B0 shim | 32.4 m² |
| Strength of main magnet | 1.06E−01 T/A |
| Strength of B0 shim alone | 1.36E−02 T/A |

It should be appreciated that various modifications of this basic design are possible within the scope of the invention. For example the main coil assembly may include coils wound in either sense and may comprise a mixture of coils with some of the coils being wound in one direction and other coils being wound in the opposite direction. In particular the main coil assembly may be arranged to provide active screening as described above. Furthermore the B0 shim coil assembly may also include coils wound in either sense and may comprise a mixture of coils wound in one direction and coils wound in the opposite direction.

Although the B0 shim coils 17, 18 and 19 are described as separately wound coils in the description with reference to FIG. 2, it should be appreciated that it would also be possible for some or all of the windings of the B0 shim coil assembly to be constituted by parts of the main coil assembly, so that these parts of the main coil assembly would form parts of both the main magnet circuit and the B0 shim coil circuit and would carry current from both circuits. The incorporation of all or part of the B0 shim coil assembly in the main coil assembly may be advantageous in certain circumstances, and may provide a simpler and less costly construction.

Figure 5:
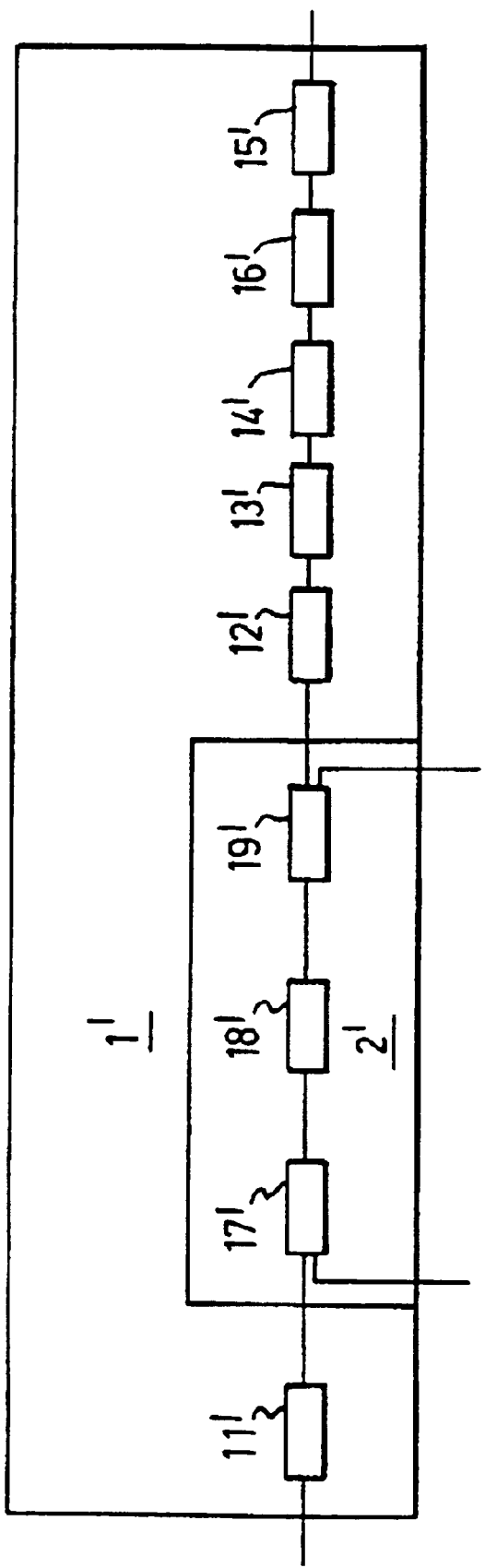

FIG. 4 is a diagram, similar to that of FIG. 1, showing a second embodiment of the invention in which the B0 shim coils 2' are constituted by parts of the main coils 1'. In FIG. 4 like reference numerals denote the same parts as in FIG. 1. Furthermore FIG. 5 diagrammatically shows the connections between the coils in this second embodiment in more detail, the coils consisting of two main magnet coils 11' and 12', smaller compensating coils 13', 14', 15' and 16' and the B0 shim coils 17', 18' and 19' having similar functions to the corresponding coils 11–19 shown in FIG. 2. Apart from the fact that the B0 shim coils 17, 18 and 19 form parts of the main coil assembly, the construction of this second embodiment is similar to that of the first embodiment.

Theoretical Basis

The following description provides what is believed to be a reasonable theoretical basis for the design of superconducting electromagnet apparatus in accordance with the invention in which a single coil assembly performs the three functions of a B0 shim, shielding and locking.

The main properties of a combined B0 shin/shielding/locking coil assembly can be deduced from three basic equations governing the main magnet/shim interactions. Equations 1 and 2 represent Faraday's law of induction applied to the main coil assembly and shim coil assembly respectively, and equation 3 is related to Ampère's law.

1. $-\dfrac{d\phi_m}{dt} = A_m \dfrac{dB_{ext}}{dt} = -L_m \dfrac{dI_m}{dt} - M \dfrac{dI_s}{dt} + I_m R_m$ 2. $-\dfrac{d\phi_s}{dt} = A_s \dfrac{dB_{est}}{dt} = -L_s \dfrac{dI_s}{dt} - M \dfrac{dI_m}{dt} + I_s R_s + \varepsilon_s$ 3. $\dfrac{dB}{dt} = S_m \dfrac{dI_m}{dt} + S_s \dfrac{dI_s}{dt} + \dfrac{dB_{ext}}{dt}$ In these equations the symbols represent the following:

| Symbol | Meaning |
|---|---|
| $A_m$ | Effective area of main coil assembly |
| $A_s$ | Effective area of B0 shim coil assembly |
| B | Central magnetic field |
| $B_{ext}$ | External (ambient) magnetic field |
| $\varepsilon_s$ | Applied emf when adjusting B0 current |
| $I_m$ | Current in main coil assembly |
| $I_s$ | Current in B0 shim coil assembly |
| $L_m$ | Self inductance of main coil assembly |
| Ls | Self inductance of B0 shim coil assembly |
| M | Mutual inductance of main/B0 shim coil assemblies |
| $\phi_m$ | Flux linking main coil assembly |
| $\phi_s$ | Flux linking B0 shim coil assembly |
| $R_m$ | Effective residual resistance of main coil assembly |
| $R_s$ | Effective residual resistance of B0 shim coil assembly |

| Symbol | Meaning |
|---|---|
| $S_m$ | Central magnetic field/current ratio for isolated main coil assembly |
| $S_s$ | Central magnetic field/current ratio for isolated B0 shim coil assembly |

A) If current is driven into the B0 shim coil assembly at a rate much faster than any external field changes and any internal magnet drift (i.e. in all practical cases), equation 1 gives $\Delta I_m = -(M/L_m)\Delta I_s$, which in equation 3 leads to an effective B0 strength of:

$$4.\quad S_{B_0} \cong \frac{\Delta B}{\Delta I_s} = S_s - \frac{M}{L_m} S_m.$$

The first term on the right-hand side of this equation is the change in the central magnetic field per amp for the isolated B0 shim coil assembly, and the second term is the effect on the central magnetic field due to the induced change in current in the main coil assembly per amp of current in the B0 shim coil assembly.

B) If the B0 shim coil assembly is in the persisted state but there are perturbations in the ambient magnetic field ($dB_{ext}/dt \neq 0$) which dominate compared to the drift of the magnet, then solving equations 1 and 2 gives:

$$5.\quad \Delta I_s = \frac{MA_m - L_m A_s}{L_m L_s - M^2} \Delta B_{ext}$$

$$\Delta I_m = \frac{MA_s - L_s A_m}{L_m L_s - M^2} \Delta B_{ext}.$$

By using equations 5 in 3, the reduction in the influence of a change in the ambient magnetic field can be shown to be:

$$6.\quad \frac{\Delta B_{est}}{\Delta B} = \left[1 + \frac{(MA_m - L_m A_s)S_s + (MA_s - L_s A_m)S_m}{L_m L_s - M^2}\right]^{-1}.$$

The first term on the right-hand side of this equation (unity) is the change in the central magnetic field with neither the main coil assembly nor the B0 shim coil assembly present. Furthermore the first part of the second term is the change in the central magnetic field due to the current induced in the B0 shim coil assembly considered as part of the complete system, that is allowing for inductive coupling with the main coil assembly. The second part of the second term is the change in the central magnetic field due to the current induced in the main coil assembly considered as part of the complete system, that is allowing for inductive coupling with the main coil assembly.

C) If the main coil assembly is in the persisted state but there are no external perturbations to the magnetic field, then the natural magnet drift (allowed for in equations 1 and 2 by the effective resistances) will become dominant. If the B0 shim coil assembly is designed such that $I_s \ll I_c$ (critical current), then we can assume that $R_s \approx 0$, and equation 2 can be substituted in equation 1 to give:

$$7.\quad \frac{1}{I_m}\frac{dI_m}{dt} = \left(\frac{M^2}{L_s} - L_m\right)^{-1} R_m$$

From this, the change in the magnetic field is found from equation 3:

$$8.\quad \frac{dB}{dt} = \frac{I_m R_m \left(S_m - S_s \frac{M}{L_s}\right)}{\left(\frac{M^2}{L_s} - L_m\right)}$$

Without the B0 shim coil assembly the main magnet drift would be:

$$9.\quad \frac{dB_m}{dt} = I_m S_m \times -\frac{R_m}{L_m},$$

so that the reduction in magnetic field change is given by:

$$10.\quad \frac{\Delta B_m}{\Delta B} = \frac{\left(1 - \frac{M^2}{L_m L_s}\right)}{\left(1 - \frac{S_s}{S_m}\frac{M}{L_s}\right)}.$$

The denominator on the right-hand side of this equation relates to the change in the central magnetic field due to the current inductively coupled into the B0 shim coil assembly relative to the change in the central magnetic field due to the current inductively coupled out of the main coil assembly. The numerator relates to the effect which the inductive coupling of the two coil assemblies has on the rate of change of current in the main coil assembly.

It will be appreciated that equations 4, 6 and 10 above can be applied to determine the optimum geometries and positioning of the main coil assembly and B0 shim coil assembly in order to provide the required locking and/or shielding in addition to the conventional B0 shim function of the B0 shim coil assembly. The effect of moving a coil (the coil 17 in FIG. 2) of the B0 shim coil assembly further towards the magnet bore is to increase $S_s$ but to decrease $A_s$, and this can result in an increase in the locking effect, although in some cases it can also lead to a decrease in the shielding effect.

What is claimed is:

1. A superconducting electromagnet apparatus comprising a main coil assembly (1; 1') for producing a central magnetic field in a working volume, main current supply means (5) connected to the main coil assembly for energising and de-energising the main coil assembly, and for persisting the superconducting current flow in the main coil assembly when a desired constant current level has been reached, in order to generate a central magnetic field of high homogeneity in the working volume, a B0 shim coil assembly (2; 2') for providing fine adjustment of the central magnetic field (B0 being the magnetic field along a central axis), the B0 shim coil assembly comprising superconducting shim coil means connected within a closed loop and arranged to magnetically couple with the main coil assembly (1; 1'), auxiliary current supply means (6) connected to the B0 shim coil assembly for supplying current to the closed loop, and for persisting the superconducting current flow in the closed loop when a desired constant current level has been reached, in order to provide fine adjustment of the central magnetic field within the working volume without significantly degrading the homogeneity of the central magnetic field, and control means (31, 38) for controlling the main and auxiliary current supply means (5, 6), wherein the main coil assembly (1; 1'), the B0 shim coil assembly (2; 2') and the control means (31, 38) provide significant compensation, resulting in a sustained improvement in performance, for the effect of variation of the magnetic field within the working volume with time whilst the current flow in the main coil assembly (1; 1') and the B0 shim coil assembly (2; 2') remains superconducting.

2. Apparatus according to claim 1, wherein the main coil assembly (1; 1'), the B0 shim coil assembly (2; 2') and the control means (31, 38) are adapted to compensate for the effect of time variation of the magnetic field within the working volume as a result of variation of the ambient magnetic field with time.

3. Apparatus according to claim 1, wherein the main coil assembly (1; 1'), the B0 shim coil assembly (2; 2') and the control means (31, 38) are adapted to compensate for the effect of time variation of the magnetic field within the working volume as a result of variation of the current flow in the main coil assembly with time.

4. Apparatus according to claim 1, wherein the B0 shim coil assembly (2; 2') is constructed from a material having a critical current value, at which the B0 shim coil assembly would revert to the normal conducting state, which is significantly greater than the value of the current required to compensate for time variation of the magnetic field within the working volume.

5. Apparatus according to claim 1, wherein the B0 shim coil assembly (2; 2') incorporates at least one coil wound on the same former as at least one coil of the main coil assembly.

6. Apparatus according to claim 1, wherein the auxiliary current supply means (6) incorporates a superconducting switch (4) including a heating element for heating the switch (4) to drive it out of its superconducting state to cause the current passing through the switch (4) to decay.

7. Apparatus according to claim 1, wherein the main current supply means (5) incorporates a superconducting switch (3) including a heating element for heating the switch (3) to drive it out of its superconducting state to cause the current in the main coil assembly (1; 1') to decay.

8. Apparatus according to claim 1, wherein the auxiliary current supply means (6) includes input terminals to which current is supplied under control of the control means (31) during initial energisation of the B0 shim coil assembly (2; 2'), such current supply to the input terminals being terminated when the current flowing in the closed loop has reached the desired level.

9. Apparatus according to claim 1, wherein the main coil assembly (1; 1') comprises a plurality of superconducting main coils connected in series within a closed loop.

10. Apparatus according to claim 1, wherein the main coil assembly (1; 1') comprises at least one coil wound in one direction and at least one other coil wound in the opposite direction.

11. Apparatus according to claim 1, wherein the B0 shim coil assembly (2; 2') comprises a plurality of superconducting shim coils connected in series within a closed loop.

12. Apparatus according to claim 11, wherein at least one of the coils of the B0 shim coil assembly (2; 2') is constituted by part of the main coil assembly.

13. Apparatus according to claim 1, wherein the B0 shim coil assembly (2; 2') comprises at least one coil wound in one direction and at least one other coil wound in the opposite direction.

14. Apparatus according to claim 1, wherein at least one further shim coil assembly (29) is provided for adjustment of the degree of homogeneity of the central magnetic field.

* * * * *